United States Patent [19]
Vansant

[11] Patent Number: 5,398,821
[45] Date of Patent: Mar. 21, 1995

[54] RACK-MOUNTABLE CHASSIS WITH RESILIENT SIDE PANELS

[75] Inventor: Glen J. Vansant, Langhorne, Pa.

[73] Assignee: General Electric Company, Philadelphia, Pa.

[21] Appl. No.: 140,339

[22] Filed: Oct. 22, 1993

Related U.S. Application Data

[63] Continuation of Ser. No. 3,211, Jan. 8, 1993, abandoned, which is a continuation of Ser. No. 792,637, Nov. 15, 1991, abandoned.

[51] Int. Cl.⁶ ............................................. A47F 7/00
[52] U.S. Cl. ....................................... 211/26; 312/332; 361/331
[58] Field of Search ............... 361/391, 394, 398; 206/305, 320; 220/528; 364/708, 925.1; 312/332; 439/297, 298, 357, 26; 211/94, 94.5, 41, 26

[56] References Cited

U.S. PATENT DOCUMENTS

| | | | |
|---|---|---|---|
| 2,551,843 | 5/1951 | Knuth | 312/332 |
| 4,285,560 | 8/1981 | Miller | 312/332 X |
| 4,649,531 | 3/1987 | Horowitz et al. | 369/270 |
| 4,815,065 | 3/1989 | Rouws | 369/77.2 |
| 4,845,700 | 7/1989 | Koizumi et al. | 369/75.2 |
| 4,937,806 | 6/1990 | Babson et al. | 369/75.1 |
| 4,949,328 | 8/1990 | Kase et al. | 369/75.2 |
| 4,979,161 | 12/1990 | Verhagen | 369/77.2 |
| 4,979,909 | 12/1990 | Andrews | 211/26 X |
| 5,004,207 | 4/1991 | Ishikawa et al. | 248/632 |

FOREIGN PATENT DOCUMENTS

| | | |
|---|---|---|
| 1490469 | 1/1971 | Germany . |
| 1490460 | 6/1971 | Germany . |
| 1490469 | 6/1971 | Germany . |
| 943077 | 4/1963 | United Kingdom . |

Primary Examiner—Ramon O. Ramirez
Assistant Examiner—Korie H. Chan
Attorney, Agent, or Firm—Geoffrey H. Krauss

[57] ABSTRACT

A rack-mountable chassis enclosure, having measurements in at least one dimension greater than the access aperture measurement of the enclosure-supporting rack in that same dimension, and providing additional empty volume into which the enclosed apparatus may move after the chassis has been mounted to the rack, is formed from a rigid panel, which can be mounted to the rack at a position to form a front boundary of the rack-enclosed volume, and at least one pair of opposed enclosure panel members extending substantially perpendicular behind the front panel and at least partially formed of a resilient material, with the maximum dimension between the outermost opposed surfaces of the resilient panel members exceeding the access aperture width of juxtaposed rack enclosure portions through which the enclosure must pass for positioning of the enclosure within the rack, and characterized by inward flexure of the resilient wall members, responsive to pressure thereupon from associated portions of the rack, during entry of the enclosure into the rack, and expansion of the wall members to their normal position once the contact between the associated rack portion and the wall member is removed.

14 Claims, 2 Drawing Sheets

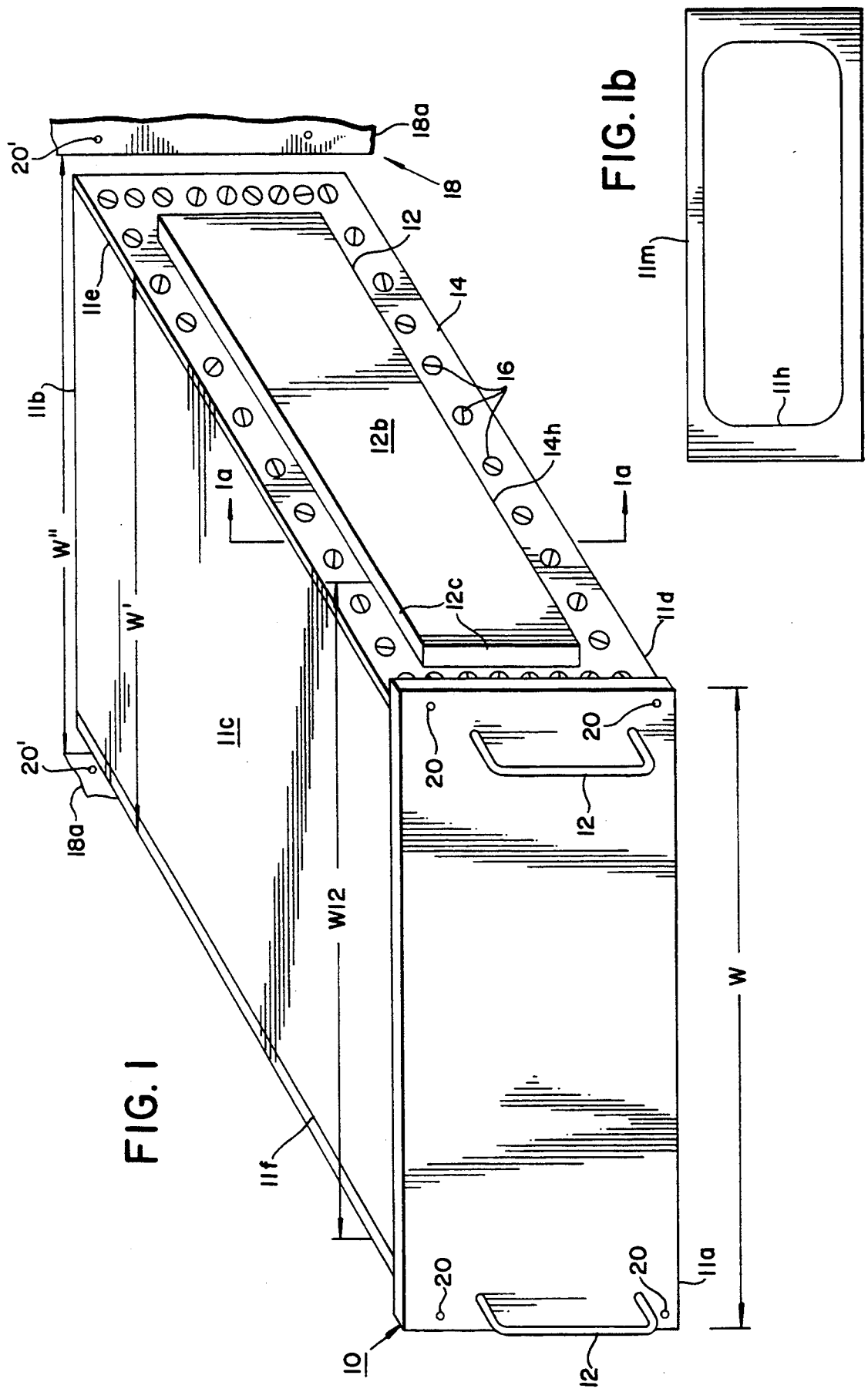

RACK-MOUNTABLE CHASSIS WITH RESILIENT SIDE PANELS

The Government of the United States has certain rights with respect to the invention herein, pursuant to Government Contract F30602-89-C-0008.

This application is a continuation of application Ser. No. 08/003,211, filed Jan. 3, 1993, which is a continuation of Ser. No. 07/792,637, filed Nov. 15, 1991, and both have been abandoned.

The present invention relates to rack-and-panel type equipment enclosures and, more particularly, to a novel rack-mountable equipment enclosure having resilient side panels.

BACKGROUND OF THE INVENTION

In the art of packaging design, it has long been a problem that certain enclosure form factors have often precluded apparatus from being easily positioned within enclosures lacking overly generous volume; where redesign is possible, the equipment can often be placed in the required enclosure only with great difficulty. In other situations, it would often appear that resolution was impossible, e.g., the classic problem of enclosing a piece of equipment requiring 2 cubic feet of volume in a 1 cubic foot container. While such a problem will most likely never be solved for most applications, I have provided a novel solution for a class of "dynamic" operational apparatus, wherein additional empty volume need be provided in which equipment movement, under shock and vibrational stimuli, can be accepted in chassis enclosures of the rack-mountable type.

BRIEF SUMMARY OF THE INVENTION

In accordance with the invention, a rack-mountable chassis enclosure, having measurements in at least one dimension greater than the access aperture measurement of the enclosure-supporting rack in that same dimension, and providing additional empty volume into which the enclosed apparatus may move after the chassis has been mounted to the rack, comprises: a rigid panel adapted for mounting to the rack at a position to form a front boundary of the rack-enclosed volume; and at least one pair of opposed enclosure panel members extending substantially perpendicular behind the front panel and at least partially formed of a resilient material, with the maximum dimension between the outermost opposed surfaces of the resilient panel members exceeding the access aperture width of juxtaposed rack enclosure portions through which the enclosure must pass for positioning of the enclosure within the rack, and characterized by inward flexure of the resilient wall members, responsive to pressure thereupon from associated portions of the rack, during entry of the enclosure into the rack, and expansion of the wall members to their normal position once the contact between the associated rack portion and the wall member is removed.

In one presently preferred embodiment, only the vertically-disposed side panels are fabricated with resilient members; in general, any one or more of the totality of surfaces perpendicular to the front panel plane and passing through the rack panel aperture (e.g. one or both of the sides and/or the top/bottom panels) can be provided as resilient panels.

The manner of operation of my novel invention will be better understood upon reading the following detailed description of a presently preferred embodiment, when considered in conjunction with the associated drawings.

BRIEF DESCRIPTION OF THE DRAWINGS

FIG. 1 is a perspective view of a chassis enclosure utilizing a pair of the resilient side panels of the present invention;

FIG. 1a is a partial sectional view through the chassis side panel of FIG. 1, at the location of arrows 1a—1a;

FIG. 1b is a plan view of the rigid portion of a chassis side panel; and

DETAILED DESCRIPTION OF A PRESENTLY PREFERRED EMBODIMENT

Figure 1A:
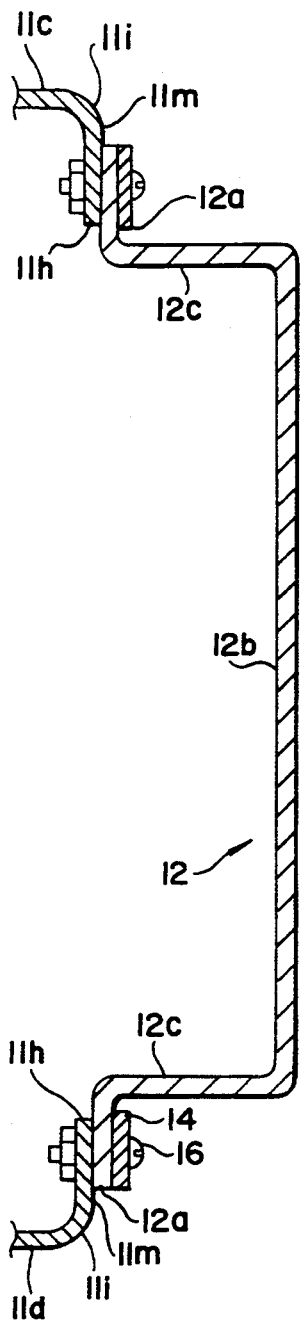

Referring initially to FIGS. 1, 1a and 1b, a chassis enclosure 10 is comprised of: a rigid front panel 11a, having a width W set by the particular rack in which the chassis is to be mounted; a rigid back panel 11b, substantially parallel to, but spaced from the front panel, and having a lesser width $W' < W$, so as to be able to pass through an access aperture in the rack; and, in one presently preferred embodiment, rigid top and bottom members 11c and 11d, respectively, which may be fixedly or removably attached between front and back panels 11a and 11b. The closure of the internal volume of chassis 10 delimited in part by walls 11a-11d is completed by first and second sidewall panels 11e and 11f. Front panel 11a may include handle means 12, typically utilized for carrying the chassis and moving it into position between the side risers 18a defining an access aperture into a rack means 18; the front panel includes several holes 20 which are aligned with rack holes 20' and have fastening means (not shown) passed therethrough to fasten the chassis to the rack. In this form of well known rack-and-panel mechanical construction, a standard panel width W is 19 inches and a standard outside chassis dimension W' might be on the order of $17\frac{1}{4}$ inches, to allow clearance between the $W'' = 17\frac{1}{2}$ inches distance between the interior facing riser edges of the EIA standard rack means 18. Allowing for the thickness of side panel members 11e/11f, about 17 inches of internal chassis enclosure width is provided.

Consider the problem of enclosing apparatus, such as an optical disk recorder and the like, which is of a size less than, but close to, the maximum interior chassis width (e.g. 17 inches). If the enclosed apparatus has a diameter of, say, 14 inches, there is no problem in fitting the apparatus within the standard rack enclosure. If the entire apparatus has a set of dimensions closely approaching the maximum chassis enclosure width, then only fractions of an inch remain between the static apparatus and the nearest interior sidewall surfaces (e.g., apparatus with a maximum width of about $16\frac{1}{4}$ inches leaves less than one-half an inch between each side of the enclosed apparatus and the nearest side panel of the enclosing chassis). It will be seen that there is no problem in statically positioning the required apparatus within a normal rigid chassis envelope. However, if the enclosed apparatus must operate in an environment which includes exposure to high shock and vibrational environmental conditions, the enclosed apparatus will, in addition to being mounted on isolation mounts inside the chassis envelope to reduce the shock and vibration transmitted from the chassis into the apparatus, also be required to have some additional volume within the enclosing chassis and around the apparatus, into which additional side volume the apparatus can sway upon its isolators when receiving mechanical shocks. The amount of apparatus sway is determined by many factors but will, in the example, require greater clearance than can be provided by the normal rigid chassis enclosure. Thus, the apparatus contained within the normal chassis enclosure will normally contact the interior rigid chassis walls when experiencing the required maximum shock magnitude; this is not an allowable condition.

In accordance with the invention, I have solved this problem by providing additional volume into which the enclosed apparatus can move, after the chassis enclosure is inserted into, and fastened to, the rack means. Each side panel 11e and 11f is formed of a frame member 11m having a central cut-out portion 11h (FIG. 1b); a resilient chassis side member 12 has a peripheral portion 12a which is of the same shape as side frame member aperture 11h, and of a size slightly greater than the aperture, so as to overlap the aperture 11h periphery. A resilient side portion 12b of the member is of substantially the same size and shape as rigid member aperture 11h and is maintained spaced outwardly therefrom and essentially parallel thereto by side wall portions 12c (FIG. 1a). A retention frame member 14 is of substantially the same (rectangular) shape and has a central aperture 14h of substantially the same interior periphery as the rigid sidewall member 11m. A plurality of fastening means 16 (such as nuts and bolts, rivets or the like) fasten rigid frame member 14 to rigid side member 11m, with the resilient side member 12 peripheral portion 12a sandwiched therebetween. Flexible side members 12 may be fabricated of molded rubber and the like and may be suitably fastened to the chassis side members by appropriate processes (such as gluing, clamping and the like).

Figure 2A:
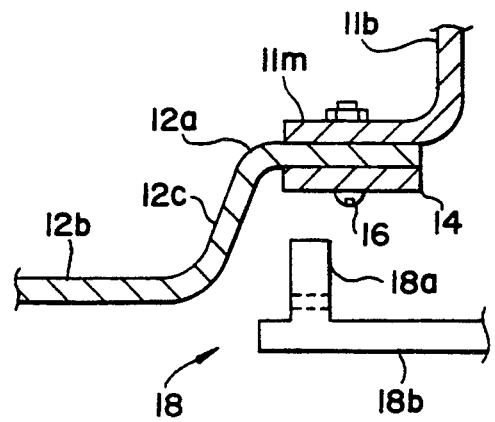
FIGS. 2a and 2b are overhead views of a portion of the supporting rack and of one chassis enclosure side panel as the chassis respectively initially enters and is almost completely within the supporting rack structure.
Figure 2B:
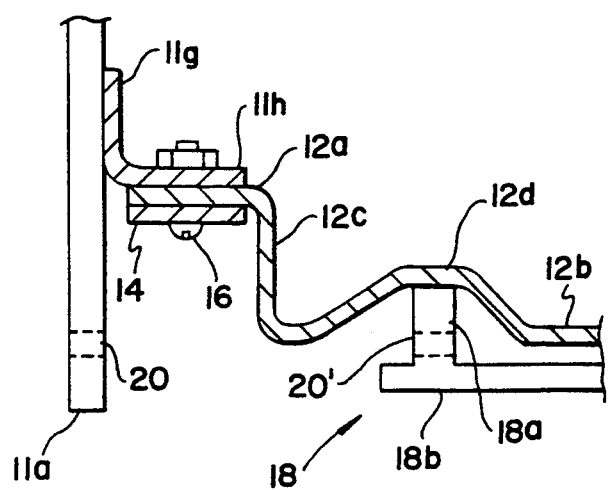

Resilient side members 12 flex under inward pressure from the abutting rack riser, when (FIG. 2a) the chassis enters the rack and pass the rack side risers 18a. The resilient side member material returns to its original shape once inside the rack so that the sides effectively "pop out" into the rack volume contained behind the risers 18a, and within the rack sides 18b, and provide additional volume for dynamic use of the apparatus inside the enclosure, which then-static apparatus will not be within the additional volume during insertion and removal into the rack. Thus, the maximum side panel exterior wall separation width W12 is greater than the rack riser separation width W''' (and may even be greater than the rack panel width W, if the design of the particular mounting rack so allows).

While one presently preferred embodiment of my rack-mountable chassis with resilient side panels is described herein, those skilled in the art will recognize that many modifications and variations of this invention can be provided. It is my intent, therefore, to be limited solely by the scope of the attendant claims and not by the specific details and instrumentalities presented by way of description herein of a presently preferred embodiment.

What I claim is:

1. A chassis enclosure having a single contiguously-enclosed internal volume with an at-rest external width measurement greater than a preselected width measurement W''', comprises:

a rigid front panel of width greater than said preselected width W'' and forming a front boundary of said single contiguously-enclosed volume;

a rigid back panel, of width less than said preselected width W''', spaced from said front panel and forming a rear boundary of said single contiguously-enclosed volume;

a first panel member having both a rigid wall portion defining a surface and a resilient portion protruding outwardly from said surface and bounding a portion of said single contiguously-enclosed internal volume, and extending between the front and back panels with each of said rigid portion and said resilient portion forming part of another boundary of said single internal contiguously-enclosed volume, and with said resilient portion including a member formed of a resilient material; and an opposing panel member also extending between the front and back panels to form yet another boundary of said contiguously-enclosed volume, and spaced apart from said first panel member;

the resilient portion member of the first panel member and the associated opposing panel member having a maximum external dimension $W_{12}$ therebetween exceeding said preselected width W''';

the resilient portion member resiliently flexing inward, toward the opposing panel member, from a normal unflexed position, responsive to pressure thereupon, and resiliently flexing outward for expansive return of the resilient portion member to the normal position once the pressure thereon is removed, to increase a total amount of the single contiguously-enclosed internal volume into which any apparatus which may be enclosed within said enclosure may move after the resilient portion member has been moved, relative to a total amount of the single contiguously-enclosed internal volume while the enclosure resilient portion member is flexed toward the opposite panel member.

2. The chassis enclosure of claim 1, wherein said opposing panel member also has a rigid portion defining another surface and a resilient portion protruding outwardly from said another surface and bounding another portion of said single contiguously-enclosed-volume with said resilient portion of said opposing panel being a member formed of a resilient material.

3. The chassis enclosure of claim 2, wherein each of the first and opposing panel members is a normally-vertically-disposed side panel member.

4. The chassis enclosure of claim 3, wherein said first panel member and said opposing panel member of said enclosure are positioned to be a pair of opposed, generally parallel, side panel members.

5. The chassis enclosure of claim 4, wherein each of the two resilient portion members is formed to protrude substantially the same amount from the associated surface of the rigid portion of each of said first panel member and said opposing panel member, respectively.

6. The chassis enclosure of claim 1, wherein said opposing panel member also includes a rigid wall portion defining another surface and a resilient portion member protruding outwardly from said another surface and bounding another portion of said single contiguously-enclosed internal volume.

7. The chassis enclosure of claim 6, wherein the first panel member and opposing panel member each has a rigid retention frame member secured to said associated rigid wall portion, with the associated resilient portion member sandwiched between said rigid wall portion and said frame member.

8. In combination, a support rack having an access aperture with a height and a width W'' between different pairs of opposed bounding edges, and a rack-mountable chassis enclosure having a single contiguously-enclosed internal volume with an at-rest external width measurement greater than said width W'' of said access aperture through which the enclosure must pass for mounting, and comprising:

a rigid front panel having a width greater than said access aperture width W'' and forming a front boundary of said single contiguously-enclosed volume;

a rigid back panel, of height and width each less than the corresponding height and width of said access aperture, and spaced from said front panel and forming a rear boundary of said single contiguously-enclosed volume;

a first panel member having both a rigid wall portion defining a surface and a resilient portion protruding outwardly from said surface and bounding a portion of said single contiguously-enclosed internal volume, and extending between the front and back panels, with each of said rigid portion and said resilient portion forming part of another boundary of said single internal contiguously-enclosed volume, and with said resilient portion including a member formed of a resilient material; and an opposing panel member also extending between the front and back panels to form yet another boundary of said contiguously-enclosed volume, and spaced apart from said first panel member at a distance to define said at-rest external width of said single contiguously-enclosed volume;

the said distance between resilient portion member of the first panel member and the associated opposing panel member being greater than said access aperture width W'';

the resilient portion member resiliently flexing inward, toward the opposing panel member, from a normal unflexed position, responsive to pressure from said access aperture edges during entry of the enclosure into the access aperture, and resiliently flexing outward for expansive return of the resilient portion member to the normal position once the pressure thereon is removed, to increase a total amount of the single contiguously-enclosed internal volume into which any apparatus which may be enclosed within said enclosure may move after the chassis has been moved to place the resilient portion member outside of said access aperture, relative to a total amount of the single contiguously-enclosed internal volume during passage of the enclosure resilient portion member through said access aperture.

9. The combination of claim 8, wherein each of the first and opposing panel members is a normally-vertically-disposed side panel member and the opposing panel member has a rigid wall portion defining another plane and at least partially formed of an associated resilient portion member.

10. The combination of claim 9, wherein said first panel member and said opposing panel member of said enclosure are positioned to be a pair of opposed, generally parallel, side panel members.

11. The combination of claim 10, wherein each of the two resilient portion members is formed to protrude substantially the same amount from the associated one of said surface of said rigid portion of each of said first panel member and said opposing panel member respectively.

12. The combination of claim 8, wherein said opposing panel members also includes a rigid wall portion defining another surface and a resilient portion member protruding outwardly from said another surface.

13. The combination of claim 12, wherein said first and opposing panel members each has a rigid retention frame member secured to said rigid wall portion, with the associated resilient portion member sandwiched between said rigid portion and said frame member.

14. The combination of claim 8, wherein said opposing panel member also has a rigid portion and at least one contiguously-enclosed-volume-defining portion being a member formed of a resilient material.

* * * * *